(12) United States Patent
Eliassi

(10) Patent No.: US 11,050,680 B2
(45) Date of Patent: Jun. 29, 2021

(54) NON-BLOCKING SWITCH MATRIX FOR MULTI-BEAM ANTENNA

(71) Applicant: Raytheon Company, Waltham, MA (US)

(72) Inventor: Ravash Eliassi, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/402,356

(22) Filed: May 3, 2019

(65) Prior Publication Data

US 2020/0351219 A1 Nov. 5, 2020

(51) Int. Cl.
*H04L 12/933* (2013.01)
*H04B 7/02* (2018.01)
*H04B 7/185* (2006.01)

(52) U.S. Cl.
CPC .......... *H04L 49/1576* (2013.01); *H04B 7/02* (2013.01); *H04B 7/18515* (2013.01)

(58) Field of Classification Search
CPC .... H04L 49/1576; H04B 7/02; H04B 7/18515
See application file for complete search history.

(56) References Cited

U.S. PATENT DOCUMENTS

| 5,309,006 | A | 5/1994 | Willems et al. |
| 10,109,441 | B1 | 10/2018 | Shayegani |
| 2007/0046326 | A1* | 3/2007 | Fujisawa ............... H04L 49/15 326/41 |
| 2008/0247411 | A1* | 10/2008 | Abel ...................... H04L 49/101 370/419 |
| 2017/0059674 | A1 | 3/2017 | Koh et al. |
| 2018/0343001 | A1 | 11/2018 | Srirattana |

FOREIGN PATENT DOCUMENTS

JP 2005348232 12/2005

OTHER PUBLICATIONS

Dumas, J. D. (2006). Computer Architecture: Fundamentals and Principles of Computer Design. United Kingdom: Taylor & Francis.*
Shi, W., Altman, E. (2011). Network and Parallel Computing: 8th IFIP International Conference, NPC 2011, Changsha, China, Oct. 21-23, 2011, Proceedings. Germany: IFIP International Federation for Information Processing.*

(Continued)

*Primary Examiner* — Yemane Mesfin
*Assistant Examiner* — Henry Baron
(74) *Attorney, Agent, or Firm* — Daly, Crowley, Mofford and Durkee, LLP

(57) ABSTRACT

A crossbar switch is disclosed having a first port, a second port, a third port, and a fourth port, the crossbar switch comprising: a first switching element coupled between the first port and the third port; a second switching element coupled between the first port and the fourth port; a third switching element coupled between the second port and the third port; and a fourth switching element coupled between the second port and the fourth port, wherein the first switching element, the second switching element, the third switching element, and the fourth switching element are configured to couple only one of the first port and the second port to the third port, at any given time.

11 Claims, 6 Drawing Sheets

(56) References Cited

OTHER PUBLICATIONS

Gupta, K. C. (1979). Microwaves. India: Wiley Eastern.*
Notes of Peter Mathys ECEN 2350 Fall 2018.*
William C. Cummings, An Adaptive Nulling Antenna for Military Satellite Communications, The Lincoln Laboratory Journal, vol. 5, No. 2, 1992, pp. 173-194 (22 pages).
Frank A. Regier, The ACTS Multibeam Antenna, IEEE Transactions on Microwave Theory and Techniques, vol. 40, No. 6, Jun. 1992, pp. 1159-1164 (6 pages).
Notification of Transmittal of the International Search Report and the Written Opinion of the ISA, or the Declaration, dated Jul. 21, 2020 for International Application No. PCT/US2020/029230; 1 page.
International Search Report dated Jul. 21, 2020 for International Application No. PCT/US2020/029230; 5 pages.
Written Opinion of the ISA dated Jul. 21, 2020 for International Application No. PCT/US2020/029230; 13 pages.

* cited by examiner

NON-BLOCKING SWITCH MATRIX FOR MULTI-BEAM ANTENNA

BACKGROUND

A matrix of switches (a switch matrix) may be used to route signals between multiple inputs and multiple outputs and are used in a wide variety of applications including, but not limited to, radar systems, telecommunication systems, and test systems. In one class of switch matrices referred to as "blocking" switch matrices, only inputs that are chosen in a static hardwired configuration can be routed simultaneously to the switch outputs (i.e. some inputs are "blocked" from some outputs). As a result, a blocking switch matrix does not permit an arbitrary set of switch inputs to be dynamically routed to the switch outputs. Accordingly, the need exists for non-blocking switch matrix designs that permit arbitrary sets of inputs to be dynamically routed to the outputs of a switch matrix.

SUMMARY

According to aspects of the concepts, circuits, systems and techniques described herein, a crossbar switch is disclosed having a first port, a second port, a third port, and a fourth port, the crossbar switch comprising: a first switching element coupled between the first port and the third port; a second switching element coupled between the first port and the fourth port; a third switching element coupled between the second port and the third port; and a fourth switching element coupled between the second port and the fourth port, wherein the first switching element, the second switching element, the third switching element, and the fourth switching element are configured to couple only one of the first port and the second port to the third port, at any given time, and wherein the first switching element, the second switching element, the third switching element, and the fourth switching element are configured to couple only one of the first port and the second port to the fourth port, at any given time.

According to aspects of the disclosure, a crossbar switch (CBS) matrix is disclosed, comprising: a plurality of crossbar switches, each of the crossbar switches including a respective first port, a respective second port, a respective third port, a respective fourth port, a respective first switching element coupled between the first port and the third port, a respective second switching element coupled between the first port and the fourth port, a respective third switching element coupled between the second port and the third port; and a respective fourth switching element coupled between the second port and the fourth port, wherein any of the first port and the second port of any of the crossbar switches is coupled to one of: (i) an input terminal of the CBS matrix or (ii) one of the third port and the fourth port of another of the crossbar switches, and wherein any of the third port and the fourth port of any of the crossbar switches is coupled to one of: (i) an output of the CBS matrix, (ii) one of the first port or the second port of another of the crossbar switches, or (iii) a termination resistor.

According to aspects of the disclosure, a crossbar switch (CBS) matrix is disclosed, comprising: a plurality of crossbar switches that are coupled to one another, each of the crossbar switches including a respective first port, a respective second port, a respective third port, a respective fourth port, a respective first switching element coupled between the first port and the third port, a respective second switching element coupled between the first port and the fourth port, a respective third switching element coupled between the second port and the third port; and a respective fourth switching element coupled between the second port and the fourth port; and electronic circuitry configured to limit a set of states which each of the plurality of crossbar switches can assume to a first state in which: (i) the first switching element and the third switching element are switched on, and (ii) the second switching element and the fourth switching element are switched off, and a second state in which: (i) the first switching element and the third switching element are switched off, and (ii) the second switching element and the fourth switching element are switched on, wherein the plurality of crossbar switches are arranged in a plurality of crossbar switch sets.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
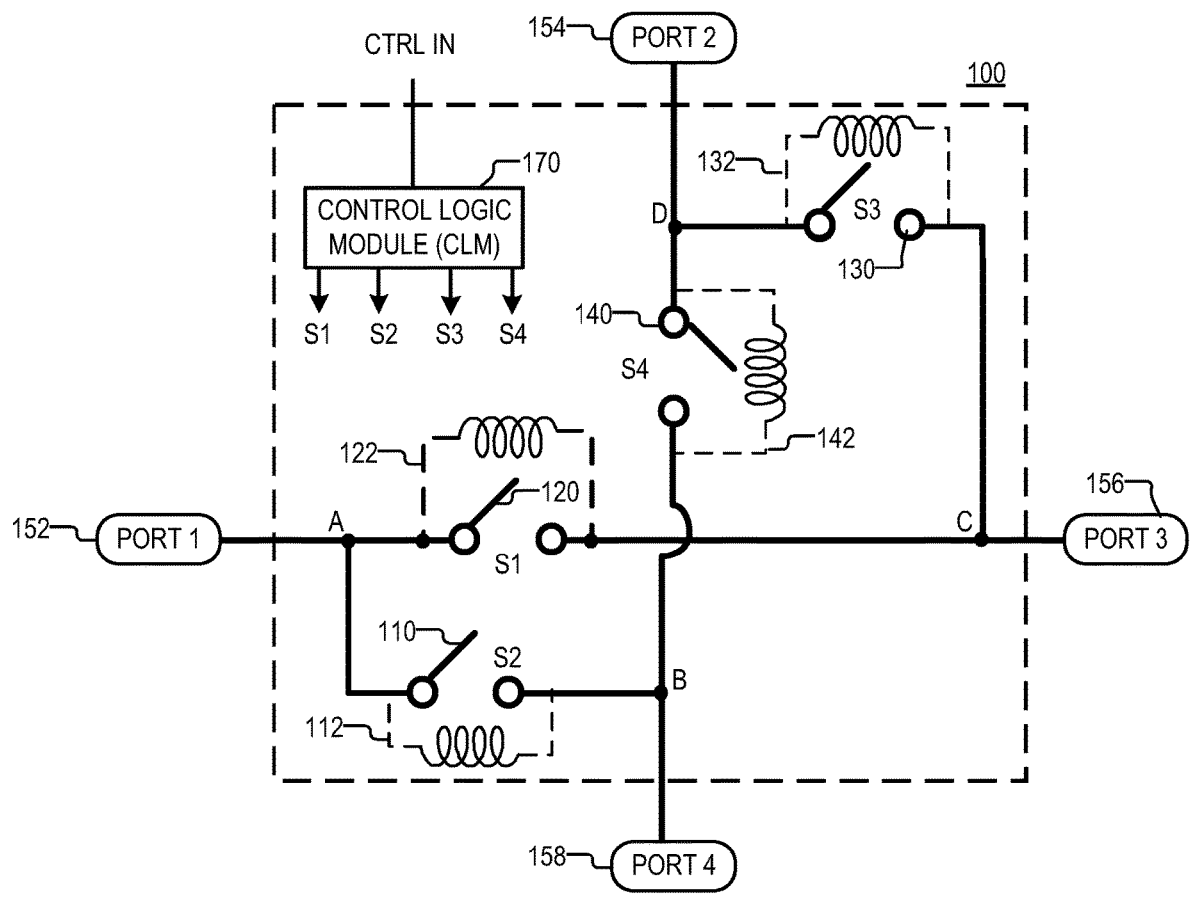
FIG. 1 is a schematic diagram illustrating an example crossbar switch, according to aspects of the disclosure.

According to one aspect of the concepts, circuits, systems and techniques described herein, disclosed is a crossbar switch having a bridge topology that includes four ports (each port may act as an input or an output depending upon the needs of a particular application. The crossbar switch includes four paths, and each path includes at least one switching element (e.g., a PiN diode). In preferred embodiments (e.g. as shown in FIG. 1), each path includes one switching element such that there are a total four switching elements embedded within the crossbar switch. Biasing circuitry (not shown in FIG. 1) provides bias signals (also referred to herein as control signals) to bias the switching elements between their conducting state (i.e. the "ON" state) and non-conducting state (i.e. their "OFF" state). Such bias signals may be, for example, bias voltages or bias currents. Thus, control signals turn the switching elements on and off, causing the crossbar switch two assume one of two distinct states during operation. The crossbar switch may support routing signals between ports whose propagation direction is orthogonal or parallel. The crossbar switch is advantageous over designs that use SPDT trees because it features a reduced count of switching elements, which in turn results in improved insertion loss and improved non-linear response.

According to another aspect of the concepts, circuits, systems and techniques described herein, a crossbar switch matrix (also referred to herein as a crossbar switch network) is disclosed that includes a plurality of crossbar switches. The plurality of crossbar switches may be arranged in a sequence of crossbar switch sets. The size of each of the crossbar switch sets may decrease from the first set in the sequence to the last set in the sequence. The crossbar switches within any of the crossbar switch sets may be coupled in series to one another.

According yet another aspect of the concepts, circuits, systems and techniques described herein, a two-stage switching device is disclosed that uses one or more crossbar switch matrices. The switching device may be used to connect X antenna input beams to Y outputs, where X>Y. The switching device is non-blocking and can connect any arbitrary input to any arbitrary output. The switching device may include two stages connected to each other with an interposer. The first stage is known as the ingress stage and its inputs may be connected to different antenna elements. The ingress stage may include one or more crossbar switch matrices. The outputs of crossbar switch matrices are routed by an interposer to the second stage, which is called the egress stage. The egress stage may include one or more binary tree switches that are implemented using SPDT switching elements.

Referring now to FIG. 1, a crossbar switch 100 includes a plurality of ports, with four ports 152, 154, 156, and 158 being shown in the illustrative embodiment of FIG. 1. A switching element 110 may be disposed on a signal path A-B, which electrically couples port 152 and port 158. A switching element 120 may be disposed on a signal path a A-C, which electrically couples port 152 and port 156. A switching element 130 may be disposed on a signal path D-C which electrically couples port 154 and port 156. And a switching element 140 may be disposed on a signal path D-B, which electrically couples port 154 and port 158. According to the present example, each of the switching elements 110-140 includes a PiN diode. However, alternative implementations are possible in which any of the switching elements 110-140 includes another type of switching element, such as a transistor switch such as a field effect transistor (FET) and in some embodiments a metal oxide semiconductor filed effect transistor (MOSFET) may be used. Stated succinctly, the concepts, circuits, systems and techniques described herein are not limited to any specific type of switching element being used to implement the crossbar switch 100.

Figure 2:
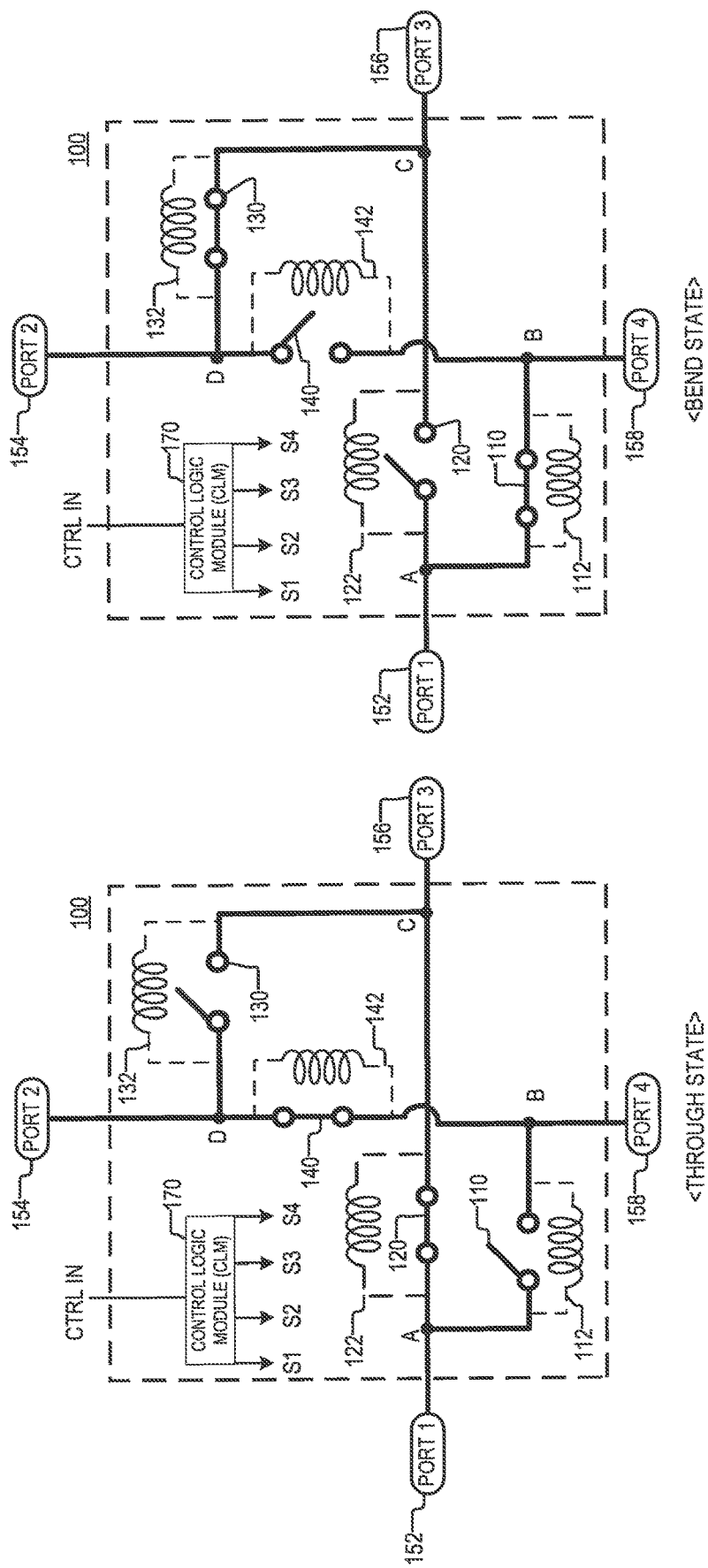
FIG. 2A is a schematic diagram illustrating the operation of the crossbar switch of FIG. 1 in a through state, according to aspects of the disclosure.
FIG. 2B is a schematic diagram illustrating the operation of the crossbar switch of FIG. 1 in a bend state, according to aspects of the disclosure.

The crossbar switch 100 may further include a control logic module (CLM) 170 for receiving a control signal CNTRL IN at input thereof and providing control signals S1-S4 to switches 110, 120, 130, 140. The CLM 170 may include one or more logic gates, and/or any other suitable type of electronic circuitry for providing control signals for switching on and off the switching elements 110-140. The CLM 170 may be configured to limit the number of states which the crossbar switch 100 can enter during its operation. As illustrated in FIGS. 2A-B, in some implementations, the CLM 170 may be configured to always maintain the crossbar switch 100 in one of two possible states. More particularly, by selectively switching on and off the switching elements 110, 120, 130 and 140, the CLM 170 may be configured to maintain the crossbar switch 100 in either a "through state" (as illustrated in FIG. 2A) or a "bend state" (as illustrated in FIG. 2A) at any given time during the operation of the crossbar switch 100 (e.g., when the crossbar switch 100 is energized).

As illustrated, in FIG. 2A, when the crossbar switch 100 is in the through state, switching elements 120 and 140 may be switched on and switching elements 110 and 130 may be switched off. As a result, signal paths A-C and D-B may be in a conducting state, and signal paths A-B and C-D may be in a non-conducting state.

As illustrated, in FIG. 2B, when the crossbar switch 100 is in the bend state, switching elements 110 and 130 may be switched off and switching elements 110 and 130 may be switched on. As a result, signal paths A-C and D-B may be in a non-conducting state, and signal paths A-B and C-D may be in a conducting state.

Optionally, in some implementations, the switch 100 may include a plurality of inductors 112, 122, 132, and 142. As illustrated, the inductor 112 may be coupled in parallel with the switching element 110; the inductor 122 may be coupled in parallel with the switching element 120; the inductor 132 may be coupled in parallel with the switching element 130; and the inductor 140 may be coupled in parallel with the switching element 142. In some respects, the inductors parallel to switching elements that are on (e.g., switching elements 120 and 140 in FIG. 2A or switching elements 110 and 130 in FIG. 2B, etc.) have no impact on RF performance as they are shorted out by the switch low on-resistance. The inductors parallel to switching elements that are off (e.g., switching elements 110 and 130 in FIG. 2A or switching elements 120 and 140 in FIG. 2B, etc.) provide inductance that cancels the switching elements' off-state capacitance. Because the off-state capacitance of the switching elements may degrade switch isolation performance, cancelling the off-state capacitance of the switching elements (by using the inductors 112, 122, 132, and 142) may enhance switch isolation. However, due to frequency dependence of the switching elements' off-state capacitance and inductors, the cancellation occurs over a narrow bandwidth. Accordingly, a tradeoff exists between crossbar isolation performance and operational bandwidth.

In some respects, the switching elements 110-140 can be implemented as a P-Type, intrinsic and N-type semiconductor (PiN) diode or a field effect transistor (FET). As illustrated in FIG. 1, switches switching elements 110 and 120 are in proximity of each other and share a common node. Accordingly, in some implementations, switching elements 110 and 120 may be integrated into the same package, which could help reduce the overall size of the switch 100. Switching elements 130 and 140 are also in proximity of each other and share a common node, and they may be integrated into the same package, as well.

Figure 3:
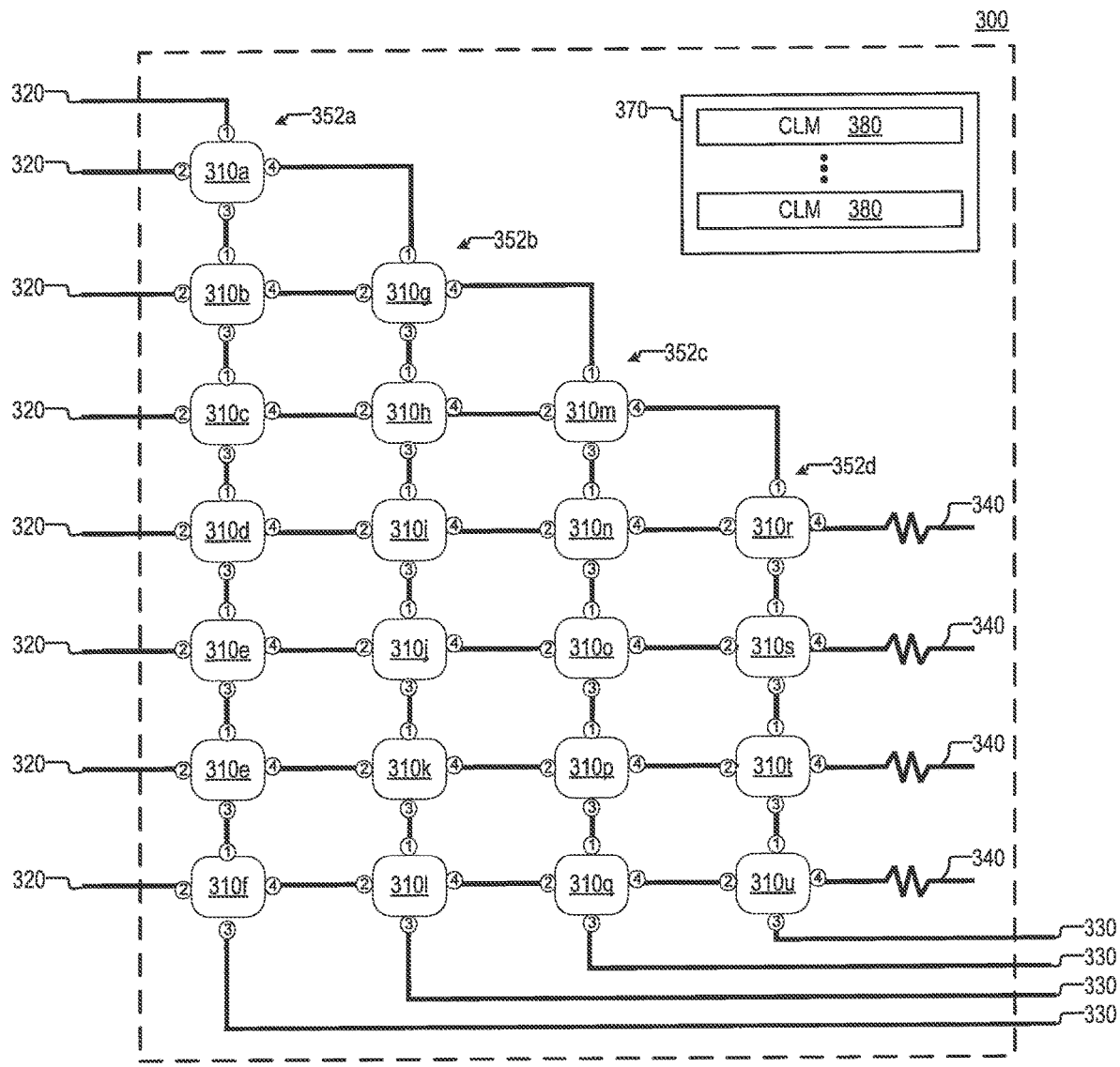
FIG. 3 is a block diagram of an example of a crossbar switch matrix, according to aspects of the disclosure.

FIG. 3 shows an example of an eight (8) port to four (4) port (8:4) crossbar switch matrix 300, according to aspects of the disclosure (e.g. eight (8) input ports to four (4) output ports or vice-versa). The matrix 300 may include a plurality of crossbar switches 310, a plurality of input terminals 320, a plurality of output ports 330, a plurality of termination resistors 340, and a control logic module array (CLMA) 370. Each of the crossbar switches 310 may be the same or similar to the crossbar switch 100, which is discussed above with respect to FIG. 1. As such, any of the crossbar switches 310 may include a total of four ports that are the same or similar to the ports 152-158, which are discussed above with respect to FIG. 1. In some implementations, a first and second ports of each crossbar switch 310 may be used as "input ports" and a third and fourth ports of the crossbar switch 310 may be used as "output ports," such that signals flow from the any of the input ports to any of the output ports, but not between the input ports or between the output ports.

The crossbar switches 310 may be arranged in a plurality of crossbar switch sets 352a-d. In particular, the crossbar switch set 352a may include crossbar switches 310a-f, which are coupled in series to one another. The crossbar switch set 352b may include crossbar switches 310g-1, which are coupled in series to one another. The crossbar switch set 352c may include crossbar switches 310m-q, which are also coupled in series to one another. And the crossbar switch set 352c may include crossbar switches 310m-q, which are coupled in series to one another, as well. As illustrated, the sets 352a-b may be arranged in a sequence, with the crossbar switch set whose crossbar switches 310 are directly coupled the input terminals 320 of the matrix 300 (i.e., the crossbar switch set 352a) being the first set in the sequence, and the crossbar switch set whose crossbar switches 310 are directly coupled to the termination resistors 340 (i.e., the crossbar switch set 352d) being the last set in the sequence. According to the present disclosure, a crossbar switch is directly coupled to another element (e.g., a crossbar switch 310, an input terminal 320, an output terminal 330, a termination resistor 340, etc.) when there are no other crossbar switches disposed on an electrical path between the crossbar switch and the other element. It will be understood that this definition does not preclude the presence of components, other than crossbar switches, on the electrical path between the crossbar switch and the other element.

Each of the crossbar switch sets 352 may include a different number of crossbar switches. Furthermore, the number of crossbar switches in each of the sets 352 may decrease by one from the set 352a to the set 352d. In accordance with this arrangement, the crossbar switch set 352a may include 7 switches, the crossbar switch set 352b may include 6 switches, the crossbar switch set 352c may include 5 switches, and the crossbar switch set 352d may include 4 switches. Although in the present example the first crossbar switch set (i.e., the set 352a) includes 7 crossbar switches, it will be understood that alternative implementations are possible in which first crossbar switch set may include M crossbar switches, wherein M is an integer greater than one. Although in the present example the last crossbar switch set (i.e., the set 352d) includes 4 crossbar switches, it will be understood that alternative implementations are possible in which the last crossbar switch set includes N switches, wherein N is an integer greater than or equal to one and smaller than M. Although in the present example the crossbar switch matrix 300 includes a total of 4 crossbar switch sets 352, it will be understood that alternative implementations are possible in which the crossbar switch matrix 300 includes K crossbar switch sets, wherein K is an integer greater than or equal to 2.

The first crossbar switch 310 in the crossbar switch set 352a may have its first and second ports directly coupled to different respective input terminals 320 of the matrix 300. Each of the remaining crossbar switches 310 in the crossbar switch set 352a may have its second port coupled to a respective input terminal 320, and its first port coupled to the third port of a preceding crossbar switch 310 in the crossbar switch set 352a. The last crossbar switch in the crossbar switch set 352a (e.g., the crossbar switch 310f) may have its third port directly coupled to one of the output terminals 330 of the matrix 300, and its fourth port coupled to the second port of last switch 310 in the crossbar switch set 352b. Each of the remaining crossbar switches 310 in the crossbar switch set 352a may have its third port coupled to the first port of a subsequent crossbar switch 310 in the crossbar switch set 352a, and its fourth port coupled to the second port of a corresponding crossbar switch 310 in the crossbar switch set 352b.

The first crossbar switch 310 in the crossbar switch set 352b may have its first and second ports coupled to the respective fourth ports of the first two crossbar switches 310 (e.g., the crossbar switches 310a and 310b) in the crossbar switch set 352a. Each of the remaining crossbar switches 310 in the crossbar switch set 352b may have its first port coupled to the third port of a preceding crossbar switch 310 in the crossbar switch set 352b, and its second port coupled to the fourth port of a corresponding switch 310 in the crossbar switch set 352a. The last crossbar switch in the crossbar switch set 352b (e.g., the crossbar switch 310l) may have its third port directly coupled to one of the output terminals 330 of the matrix 300, and its fourth port coupled to the second port of the last crossbar switch 310 (e.g., the crossbar switch 310q) in the crossbar switch set 352c. Each of the remaining crossbar switches 310 in the crossbar switch set 352b may have its third port coupled to the first port of a subsequent crossbar switch 310 in the crossbar switch set 352b, and its fourth port coupled to the second port of a corresponding crossbar switch 310 in the crossbar switch set 352c.

The first crossbar switch 310 in the crossbar switch set 352c may have its first and second ports coupled to the respective fourth ports of the first two crossbar switches 310 (e.g., the crossbar switches 310g and 310h) in the crossbar switch set 352b. Each of the remaining crossbar switches 310 in the crossbar switch set 352c may have its first port coupled to the third port of a preceding crossbar switch 310 in the crossbar switch set 352c, and its second port coupled to the fourth port of a corresponding crossbar switch 310 that is part of the crossbar switch set 310b. The last crossbar switch in the crossbar switch set 352c (e.g., the crossbar switch 310q) may have its third port directly coupled to one of the output terminals 330 of the matrix 300, and its fourth port coupled to the second port of the last crossbar switch 310 (e.g., the crossbar switch 310u) in the crossbar switch set 352d. Each of the remaining crossbar switches 310 in the crossbar switch set 352c may have its third port coupled to the first port of a subsequent crossbar switch 310 in the crossbar switch set 352c, and its fourth port coupled to the second port of a corresponding crossbar switch 310 in the crossbar switch set 352d.

The first crossbar switch 310 in the crossbar switch set 352d (e.g., the crossbar switch 310r) may have its first and second ports coupled to the respective fourth ports of the first two crossbar switches 310 (e.g., the crossbar switches 310m and 310n) in the crossbar switch set 352c. Each of the remaining crossbar switches 310 in the crossbar switch set 352d may have its first port coupled to the third port of a preceding crossbar switch in the crossbar switch set 352d, and its second port coupled to the fourth port of a corresponding crossbar switch 310 in the crossbar switch set 352c. The last crossbar switch in the crossbar switch set 352d (e.g., the crossbar switch 310u) may have its third port directly coupled to an output terminal 330 of the matrix 300, and its fourth port coupled to a respective termination resistor 340. Each of the remaining crossbar switches 310 in the crossbar switch set 352d may have its third port coupled to the first port of a subsequent crossbar switch 310 in the crossbar switch set 352d, and its fourth port coupled to a respective termination resistor 340.

The control array 370 may include a plurality of CLMs 380. Each of the CLMs 480, may be the same or similar to the CLM 170, which is discussed with respect to FIG. 1. As such, each of the CLMs 380 may be configured limit the possible states which the CLMs respective crossbar switch 310 can assume to the through state and the bend state. Although in the present example, the CLMs 380 are depicted as discrete entities, it will be understood that in some implementations, two or more of the CLMs 380 may be integrated into the same unit.

Figure 4:
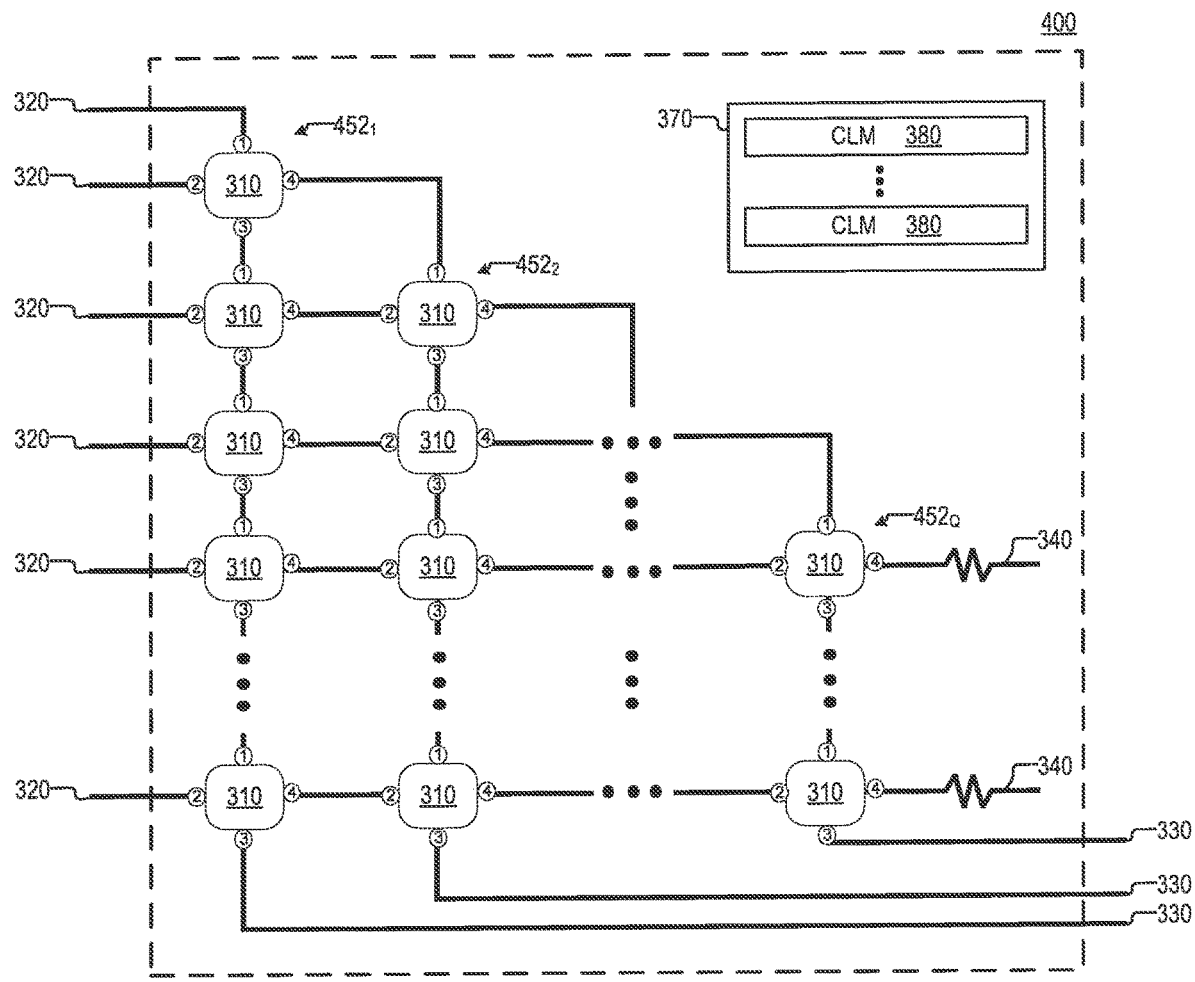
FIG. 4 is a block diagram of another example of a crossbar switch matrix, according to aspects of the disclosure.

FIG. 4 is a diagram of an example of a crossbar switch matrix 400, according to aspects of the disclosure. FIG. 4 is provided to illustrate that the design discussed with respect to FIG. 3 can be scaled up and down, as desired. As illustrated, the matrix 400 may include a plurality of crossbar switches 310, a plurality of input terminals 320, a plurality of output ports 330, a plurality of terminal resistors 340, and a CLMA 370. The crossbar switches 310 may be arranged in Q crossbar switch sets 452, where Q is any positive integer greater than or equal to two. The crossbar switch sets 452 may be arranged in a sequence, as shown. The first crossbar switch set 452 in the sequence may be the crossbar switch set 452 whose constituent crossbar switches 310 are directly coupled to the input terminals 320 of the matrix 400. The last crossbar switch set 452 in the sequence may be the crossbar switch set 452 whose constituent crossbar switches 310 are directly coupled to the termination resistors 340 of the matrix 400. The count of crossbar switches 310 that are present in each of the crossbar switch sets 452 may decrease by one from the first set 452 to the last set 452. In this regard, the first crossbar set 452 in the sequence of crossbar sets may include R crossbar switches 310, where R is a positive integer greater than or equal to two, and the S-th crossbar switch set 452 in the sequence of crossbar switch sets may include R-S-1 crossbar switches, where S is a positive integer greater than or equal to two and smaller than R.

The crossbar switches 310 in each of the crossbar switch sets 452 may be coupled in series to one another. The first and second ports of the first switch 310 in the first set 452 (i.e., set $452_1$, etc.) may be directly coupled to respective input terminals 320 of the matrix 400. The second port of each of the remaining crossbar switches 310 in the first set 452 may be coupled to a respective input terminal 320 of the matrix 400, and the first port may be coupled to third port of a preceding crossbar switch 310 in the first set 452. The third port of the last crossbar switch 310 in the first set 452 may be directly coupled to one of the output terminals 330 of the matrix 400, and the fourth port of the last crossbar switch 310 may be coupled to the second port of the last crossbar switch 310 in the next set 452 (i.e., set $452_2$ etc.). The third port of each of the remaining crossbar switches 310 in the first set 452 may be coupled to the first port of a subsequent crossbar switch 310 in the first set 452, and the fourth port or each of the remaining crossbar switches 310 may be coupled to the second port of a corresponding crossbar switch 310 in the next set 452.

The first and second ports of the first switch 310 in the last set 452 (i.e., set $452_Q$, etc.) may be coupled to the fourth ports of the first two crossbar switches 310 in the preceding set 452 (i.e., set $452_{Q-1}$, etc.). The first port of each of the remaining crossbar switches 310 in the last set 452 may be coupled to the third port of a preceding crossbar switch 310 in the last set 452, and the second port may be coupled to fourth port of a corresponding crossbar switch 310 in the preceding crossbar switch set 452. The third port of the last crossbar switch 310 may be coupled to a respective output terminal 330 of the matrix 400, and the fourth port may be coupled to a respective termination resistor 340. The third port of each of the remaining crossbar switches 310 in the last set 452 may be coupled to the first port of a subsequent crossbar switch 310 in the last set 452, and the fourth port may be coupled to a respective termination resistor 340.

In each remaining set $452_Z$ in the matrix 400, where 1<Z<Q, the first and second ports of the first switch 310 may be coupled to the fourth ports of the first two crossbar switches 310 in a preceding set 452 (e.g., a set $452_{Z-1}$, etc.). The first port of any other switches 310 in the remaining set 452 may be coupled to the third port of a preceding switch 310 in the same set 452. The second port of any other switches 310 in the remaining set 452 may be coupled to the fourth port of a corresponding crossbar switch 310 in the preceding set 452. The third port of the last switch 310 in the remaining set 452 may be coupled to a respective output terminal 330 of the matrix 400. The fourth port of the last switch in the remaining set 452 may be coupled to the second port of a corresponding crossbar switch 310 in a subsequent set 452 (e.g., a set $452_{Z+1}$, etc.). The third port of any other switches 310 in the remaining set 452 may be coupled to the first port of a subsequent crossbar switch 310 in the same set 452. The fourth port of any other switches 310 in the remaining set 452 may be coupled to the second port of a corresponding crossbar switch 310 in the subsequent set 452.

Figure 5:
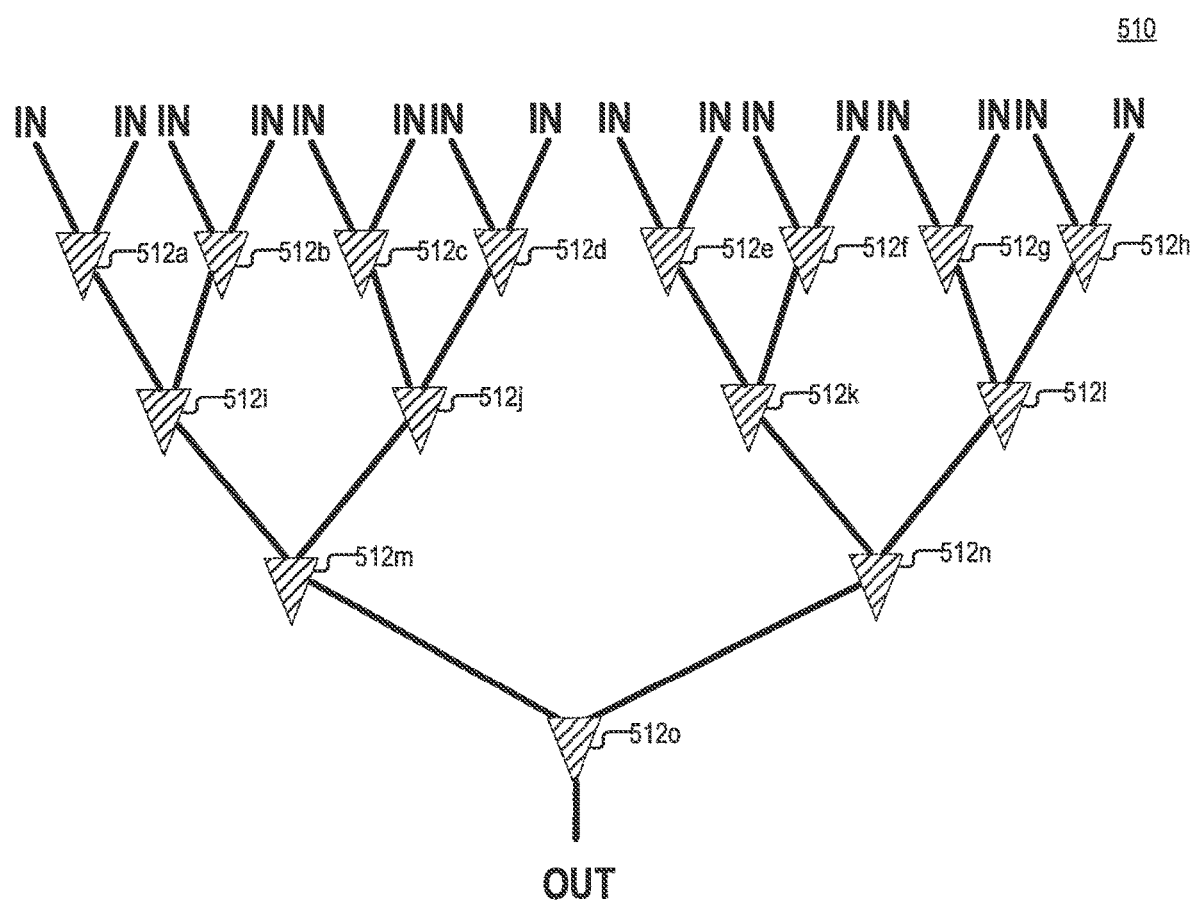
FIG. 5 is a block diagram of an example of a binary tree switch according to aspects of the disclosure.

FIG. 5 is a diagram of an example of a 16:1 binary tree switch 510, according to aspects of the disclosure. The binary tree switch 510 may include a plurality of single-pull-double-throw (SPDT) switches 512. The SPDT switches 512 may be arranged in a binary tree formation, in which switches 512a-h are the leaves, and SPDT switch 510o is the root. In operation, the binary tree switch 510 may be configured to receive a plurality of input signals IN at SPDT switches 510a-h and output an output signal OUT from SPDT switch 512o. The signal OUT may be the same as a selected one of the signals IN. The selected one of the signals IN may be routed to the output port of the binary tree switch 510 by changing the respective states of SPDT switches 512a-o in a well-known fashion.

Figure 6:
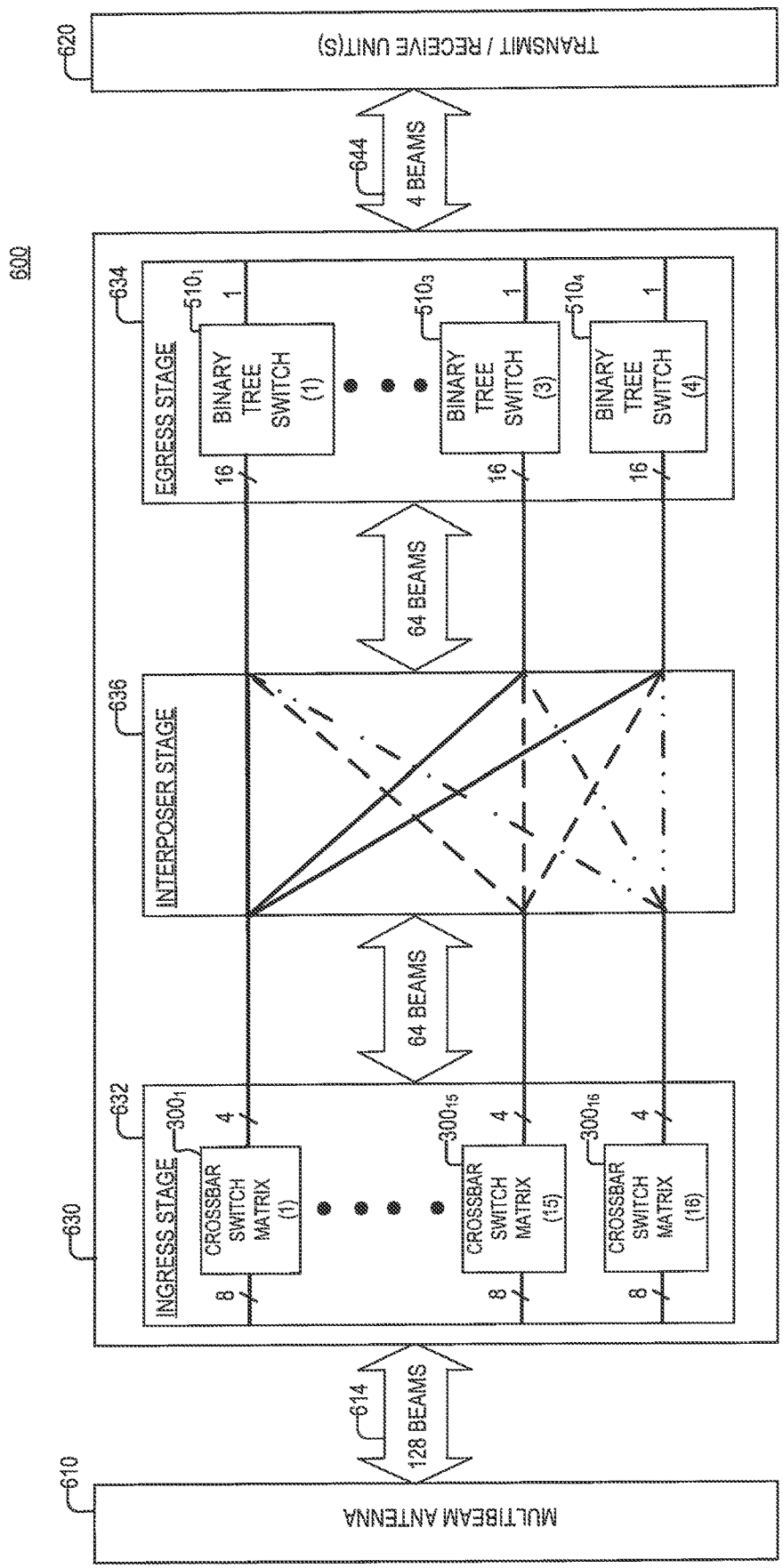
FIG. 6 is a block diagram of an example transmit/receive system utilizing a plurality of crossbar switch matrices at least some of which may be the same as or similar to the crossbar switch matrix of FIG. 3, according to aspects of the disclosure.

FIG. 6 is a diagram of an example of a system 600, according to aspects of the disclosure. The system 600 may include an antenna 610 configured to provided multiple outputs that is coupled to one or more transmit/receive units 620 via a switch 630. In embodiments, antenna 610 may be provided as a multibeam antenna.

In operation, the switch 630 may be configured to receive a set of input signals 614 from the antenna 610 and output a subset 644 of the input signals 614 to the transmit/receive unit(s) 620. The switch 630 may include an ingress stage 632 that is coupled to an egress stage 634 via an interposer stage 636. The switch 630 is non-blocking and can connect any arbitrary input to any arbitrary output.

The ingress stage 632 may include crossbar switch matrices $300_{1-16}$, as shown. As the numbering suggests, each of the crossbar switch matrices $300_{1-16}$ may be the same or similar to the crossbar switch matrix 300, which is discussed above with respect to FIG. 3. Each of the crossbar switch matrices $300_{1-16}$ may be configured to receive a different respective subset of the input signals 614, which includes eight input signals, and output four of those signals to the egress stage 634, via the interposer stage 636. In some implementations, each of the crossbar switch matrices $300_{1-16}$ may be configured to receive a different subset of the input signals 614, such that no two subsets include the same signal. Using the crossbar switch matrices $300_{1-16}$ to implement the ingress stage 632 is advantageous because it reduces the count of switching elements that are necessary to implement the ingress stage 632 (as opposed to when binary tree switches or another type of switch is used).

The egress stage 634 may include binary tree switches $510_{1-4}$. As the numbering suggests, each of the binary tree switches $510_{1-4}$ may be the same or similar to the binary tree switch 510, which is discussed above with respect to FIG. 5. Each binary tree switch may be configured to receive sixteen input signals, and output one of those signals to the transmit/receive unit(s) 620. In some implementations, each of the input signals received at any of the binary trees $510_{1-16}$ may be provided by a different one of the crossbar switch matrices $300_{1-16}$, such that none of the binary tree switches $510_{1-16}$ receives more than one signal from any of the crossbar switch matrices $300_{1-16}$.

The interposer stage 636 may provide a plurality of signals paths (e.g. a "fabric") for connecting the ingress stage 632 to the egress stage 634. As such, the interposer stage 636 may include a plurality of signal paths (e.g., electrically conductive signal paths including but not limited to printed circuit signal paths, wires or tracks) that are electrically insulated from one another. Each of the signal paths may couple a different one of the output terminals of the crossbar switch matrices $300_{1-16}$ to a respective input terminal of each of the binary tree switches $510_{1-16}$.

Although in the present example, the switch 630 is a 128:4 switch, the present disclosure is not limited to any specific ratio of ports. For example, in some implementations, the switch 630 may include a 64:4 or 32:6 switch, etc. Although in the present example, the ingress stage 632 includes sixteen crossbar modules 300, the present disclosure is not limited to any specific number of crossbar modules 300 being included in the ingress stage 632. In this regard, it will be understood that alternative implementations are possible in which the ingress stage 632 includes a different number of crossbar modules, such as eight crossbar modules, seven crossbar modules, or four crossbar modules, for example. Although in the present example, the ingress stage 632 includes 8:4 crossbar modules, the present disclosure is not limited to any specific aspect ratio of the crossbar modules included in the ingress stage 632. In this regard, it will be understood that alternative implementations are possible in which the ingress stage 632 includes 4:2 or 16:8 switches, for example. Although in the present example all crossbar modules in the ingress stage 632 have the same aspect ratio, it will be understood that alternative implementations are possible in which at least two of the crossbar switch matrices have different aspect ratios.

Although in the present example, the egress stage 634 includes four binary tree switches, the present disclosure is not limited to any specific number of binary tree switches being included in the egress stage 634. In this regard, it will be understood that alternative implementations are possible in which the egress stage 634 includes a different number of binary tree switches, such as eight binary tree switches, seven binary tree switches, or two binary tree switches, for example. Although in the present example, the egress stage 634 includes 16:1 binary tree switches, the present disclosure is not limited to any specific aspect ratio of the binary tree switches. In this regard, it will be understood that alternative implementations are possible in which the egress stage 634 includes 4:1 or 8:1 binary tree switches, for example. Although in the present example all binary tree switches in the egress stage 634 have the same aspect ratio, it will be understood that alternative implementations are possible in which at least two of the binary tree switches have different aspect ratios.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "coupled" refer to any manner known in the art or later developed in which energy is allowed to be transferred between two or more elements, and the interposition of one or more additional elements is contemplated, although not required. Conversely, the terms "directly coupled," "directly coupled," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A crossbar switch (CBS) matrix, comprising:
a plurality of crossbar switches, each of the crossbar switches including a respective first port, a respective second port, a respective third port, a respective fourth port, a respective first switching element coupled between the first port and the third port, a respective second switching element coupled between the first port and the fourth port, a respective third switching element coupled between the second port and the third port; and a respective fourth switching element coupled between the second port and the fourth port; and
electronic circuitry configured to cause each of the crossbar switches to be in one of a first state or a second state at any given time during operation of the crossbar switch, wherein: the first state includes a state in which: (i) the first switching element and the third switching element are switched on, and (ii) the second switching element and the fourth switching element are switched off, and the second state includes a state in which: (i) the first switching element and the third switching element are switched off, and (ii) the second switching element and the fourth switching element are switched on,
wherein the crossbar switches are arranged in a sequence of crossbar switch sets, such that the size of the crossbar switch sets decreases from a first crossbar switch set in the sequence to a last crossbar switch set in the sequence, and the fourth port of each crossbar switch in the last crossbar switch set in the sequence is coupled to a termination resistor.

2. The CBS matrix of claim 1, wherein:
the third port of any given one of the plurality of crossbar switches is coupled to one of: (i) the respective first port of another one of the plurality of crossbar switches that is part of the same crossbar switch set as the given crossbar switch, or (ii) an output terminal of the CBS matrix.

3. The CBS matrix of claim 1, wherein:
any given one of the plurality of crossbar switches is coupled to at least one other switch that is part of the same crossbar switch set as the given crossbar switch, and another one of the plurality of crossbar switches that is part of different crossbar switch set than the given crossbar switch.

4. The CBS matrix of claim 1, wherein:
the first port of only one of the crossbar switches in the first crossbar switch set is coupled to a respective input terminal of the CBS matrix, while the first port of any remaining crossbar switches in the first crossbar set is coupled to the third port of another one of the crossbar switches in the first crossbar switch set, and
the second port of each of the crossbar switches in the first crossbar switch set is coupled to a respective input terminal of the CBS matrix.

5. The CBS matrix of claim 1, wherein:
the third port of only one of the crossbar switches in the last crossbar switch set is coupled to a respective output terminal of the CBS matrix, while the third port of each remaining crossbar switch in the last crossbar switch set is coupled to the first port of another one of the crossbar switches in the last crossbar switch set.

6. A crossbar switch (CBS) matrix, comprising:
a plurality of crossbar switches that are coupled to one another, each of the crossbar switches including a respective first port, a respective second port, a respective third port, a respective fourth port, a respective first switching element coupled between the first port and the third port, a respective second switching element coupled between the first port and the fourth port, a respective third switching element coupled between the second port and the third port; and a respective fourth switching element coupled between the second port and the fourth port; and
electronic circuitry configured to limit a set of states which each of the plurality of crossbar switches can assume to a first state in which: (i) the first switching element and the third switching element are switched on, and (ii) the second switching element and the fourth switching element are switched off, and a second state in which: (i) the first switching element and the third switching element are switched off, and (ii) the second switching element and the fourth switching element are switched on, and
wherein the crossbar switches are arranged in a sequence of crossbar switch sets, such that the size of the crossbar switch sets decreases from a first crossbar switch set in the sequence to a last crossbar switch set in the sequence.

7. The CBS matrix of claim 6, wherein:
any of the first port and the second port of any of the crossbar switches is coupled to one of: (i) an input terminal of the CBS matrix or (ii) one of the third port and the fourth port of another of the crossbar switches, and
any of the crossbar switches is coupled to one of: (i) an output of the CBS matrix, (ii) one of the first port or the second port of another of the crossbar switches, or (iii) a termination resistor.

8. The CBS matrix of claim 6, wherein:
the third port of any given one of the plurality of crossbar switches is coupled to one of: (i) the respective first port of another one of the plurality of crossbar switches that is part of the same crossbar switch set as the given crossbar switch, or (ii) an output terminal of the CBS matrix.

9. The CBS matrix of claim 6, wherein:
any given one of the plurality of crossbar switches is coupled to at least one other switch that is part of the same crossbar switch set as the given crossbar switch, and another one of the plurality of crossbar switches that is part of different crossbar switch set than the given crossbar switch.

10. The CBS matrix of claim 6, wherein:
the first port of only one of the crossbar switches in the first crossbar switch set is coupled to a respective input terminal of the CBS matrix, while the first port of any remaining crossbar switches in the first crossbar set is coupled to the third port of another one of the crossbar switches in the first crossbar switch set, and
the second port of each of the crossbar switches in the first crossbar switch set is coupled to a respective input terminal of the CBS matrix.

11. The CBS matrix of claim 6, wherein:
the third port of only one of the crossbar switches in the last crossbar switch set is coupled to a respective output terminal of the CBS matrix, while the third port of each remaining crossbar switch in the last crossbar switch set is coupled to the first port of another one of the crossbar switches in the last crossbar switch set.

* * * * *